(12) United States Patent
Assefa et al.

(10) Patent No.: US 7,897,428 B2
(45) Date of Patent: *Mar. 1, 2011

(54) THREE-DIMENSIONAL INTEGRATED CIRCUITS AND TECHNIQUES FOR FABRICATION THEREOF

(75) Inventors: Solomon Assefa, Ossining, NY (US); Kuan-Neng Chen, White Plains, NY (US); Steven J. Koester, Ossining, NY (US); Yurii A. Vlasov, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

This patent is subject to a terminal disclaimer.

(21) Appl. No.: 12/131,988

(22) Filed: Jun. 3, 2008

(65) Prior Publication Data
US 2009/0294814 A1 Dec. 3, 2009

(51) Int. Cl.
*H01L 27/12* (2006.01)
(52) U.S. Cl. .................. 438/98; 438/149; 438/479; 438/517; 257/E21.7; 257/E27.112
(58) Field of Classification Search ............. 257/67, 257/74, 292, 527, 627–628; 438/98, 149, 438/479, 517
See application file for complete search history.

(56) References Cited
U.S. PATENT DOCUMENTS

| | | | |
|---|---|---|---|
| 5,455,193 A | 10/1995 | Egloff | |
| 5,514,885 A | 5/1996 | Myrick | |
| 5,674,758 A | 10/1997 | McCarthy | |
| 6,912,759 B2 | 7/2005 | Izadnegahdar et al. | |
| 6,913,941 B2 | 7/2005 | O'Brien et al. | |
| 6,927,432 B2 | 8/2005 | Holm et al. | |
| 6,984,571 B1 * | 1/2006 | Enquist | 438/459 |
| 6,984,816 B2 | 1/2006 | Holm et al. | |
| 7,104,130 B2 | 9/2006 | Kenny et al. | |
| 7,214,999 B2 | 5/2007 | Holm et al. | |
| 7,253,083 B2 | 8/2007 | Clarke et al. | |

(Continued)

OTHER PUBLICATIONS

J.M. Fedeli, "Heterogeneous Integration of III-V Sources and Detectors with Silicon Photonics Wires by Wafer-Scale CMOS-compatible Processes," ECOC Conference (Nov. 2007).

(Continued)

*Primary Examiner*—A. Sefer
(74) *Attorney, Agent, or Firm*—Vazken Alexanian; Michael J. Chang, LLC

(57) ABSTRACT

Integrated circuits having complementary metal-oxide semiconductor (CMOS) and photonics circuitry and techniques for three-dimensional integration thereof are provided. In one aspect, a three-dimensional integrated circuit comprises a bottom device layer and a top device layer. The bottom device layer comprises a substrate; a digital CMOS circuitry layer adjacent to the substrate; and a first bonding oxide layer adjacent to a side of the digital CMOS circuitry layer opposite the substrate. The top device layer comprises an analog CMOS and photonics circuitry layer formed in a silicon-on-insulator (SOI) layer having a buried oxide (BOX) with a thickness of greater than or equal to about 0.5 micrometers; and a second bonding oxide layer adjacent to the analog CMOS and photonics circuitry layer. The bottom device layer is bonded to the top device layer by an oxide-to-oxide bond between the first bonding oxide layer and the second bonding oxide layer.

12 Claims, 14 Drawing Sheets

U.S. PATENT DOCUMENTS

| | | |
|---|---|---|
| 7,425,461 B2 | 9/2008 | Mouli |
| 7,470,598 B2 | 12/2008 | Lee |
| 7,480,425 B2 | 1/2009 | Gunn et al. |
| 7,521,798 B2 | 4/2009 | Adkisson et al. |
| 2005/0095810 A1 | 5/2005 | Nakata et al. |
| 2005/0110159 A1* | 5/2005 | Oh et al. .................. 257/777 |
| 2006/0033110 A1* | 2/2006 | Alam et al. ................. 257/74 |
| 2006/0177173 A1* | 8/2006 | Shastri et al. ............... 385/14 |
| 2009/0297091 A1* | 12/2009 | Assefa et al. ............... 385/14 |
| 2010/0059822 A1* | 3/2010 | Pinguet et al. .............. 257/351 |

OTHER PUBLICATIONS

Andry et al., "A CMOS-Compatible Process for Fabricating Electrical Through-Vias in Silicon," 56th ECTC (2006).

Patel et al., "Silicon Carrier With Deep Through-Vias, Fine Pitch Wiring and Through Cavity for Parallel Optical Transceiver," 55th ECTC (2005).

Knickerbocker et al., "Development of Next-Generation System-on-Package (SOP) Technology Based on Silicon Carriers With Fine-Pitch Chip Interconnection," IBM J. Res. Develop., vol. 49 (2005).

* cited by examiner

100

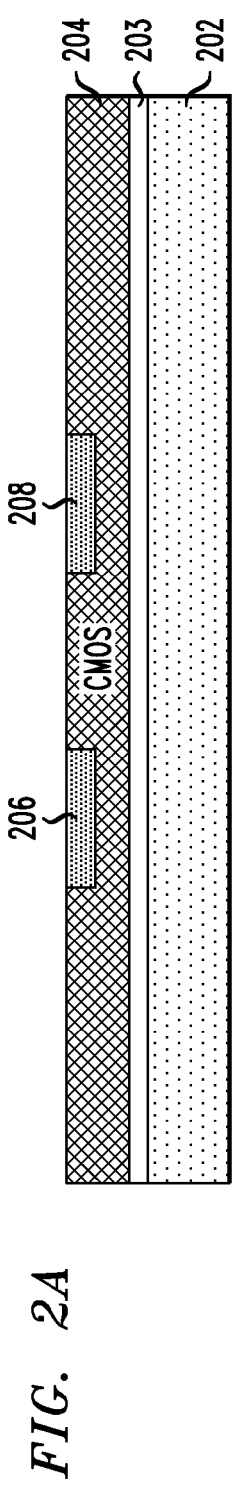
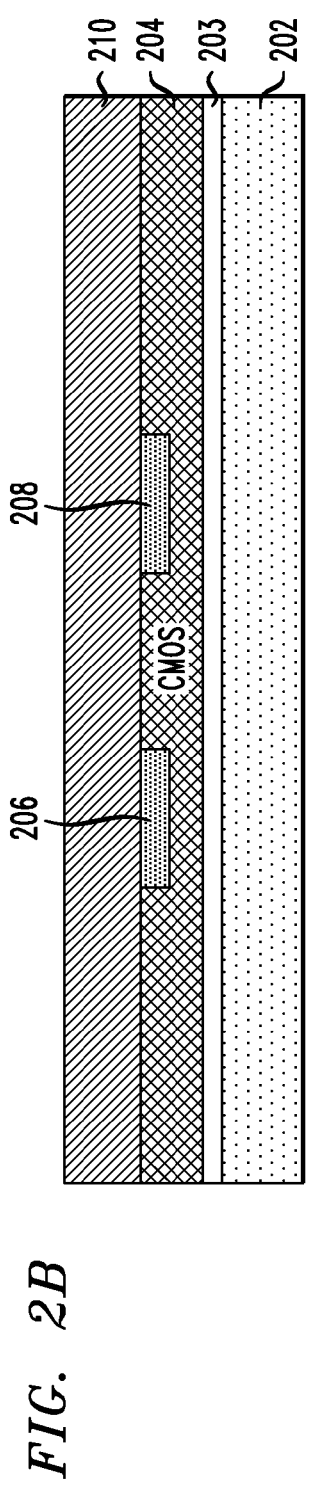
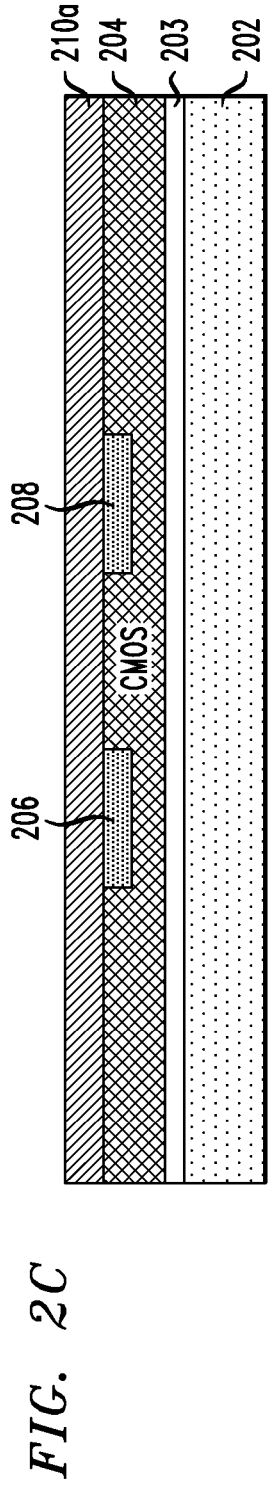
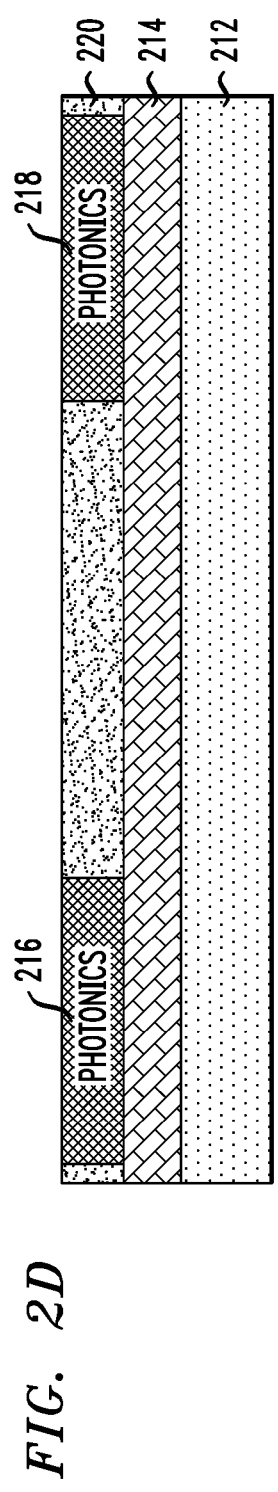
FIG. 2A
FIG. 2B
FIG. 2C
FIG. 2D

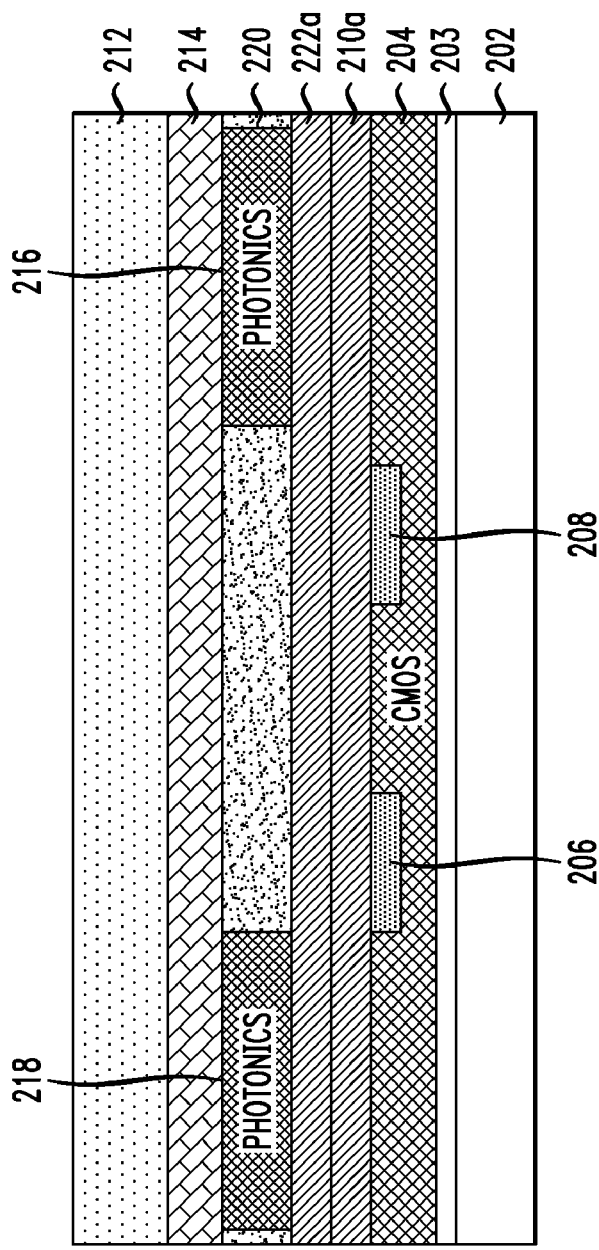
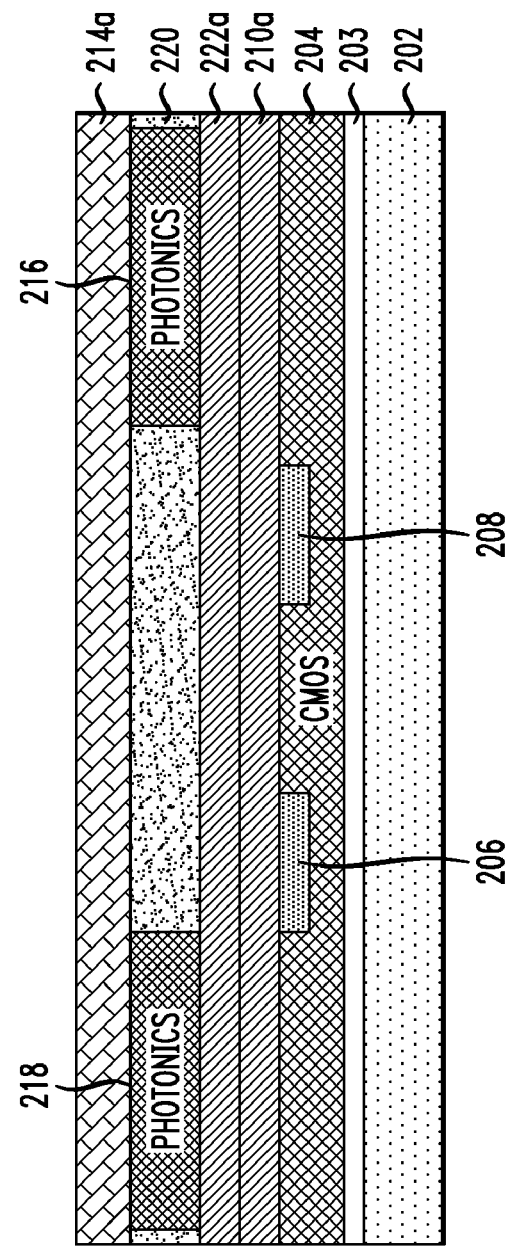
FIG. 2H
FIG. 2I

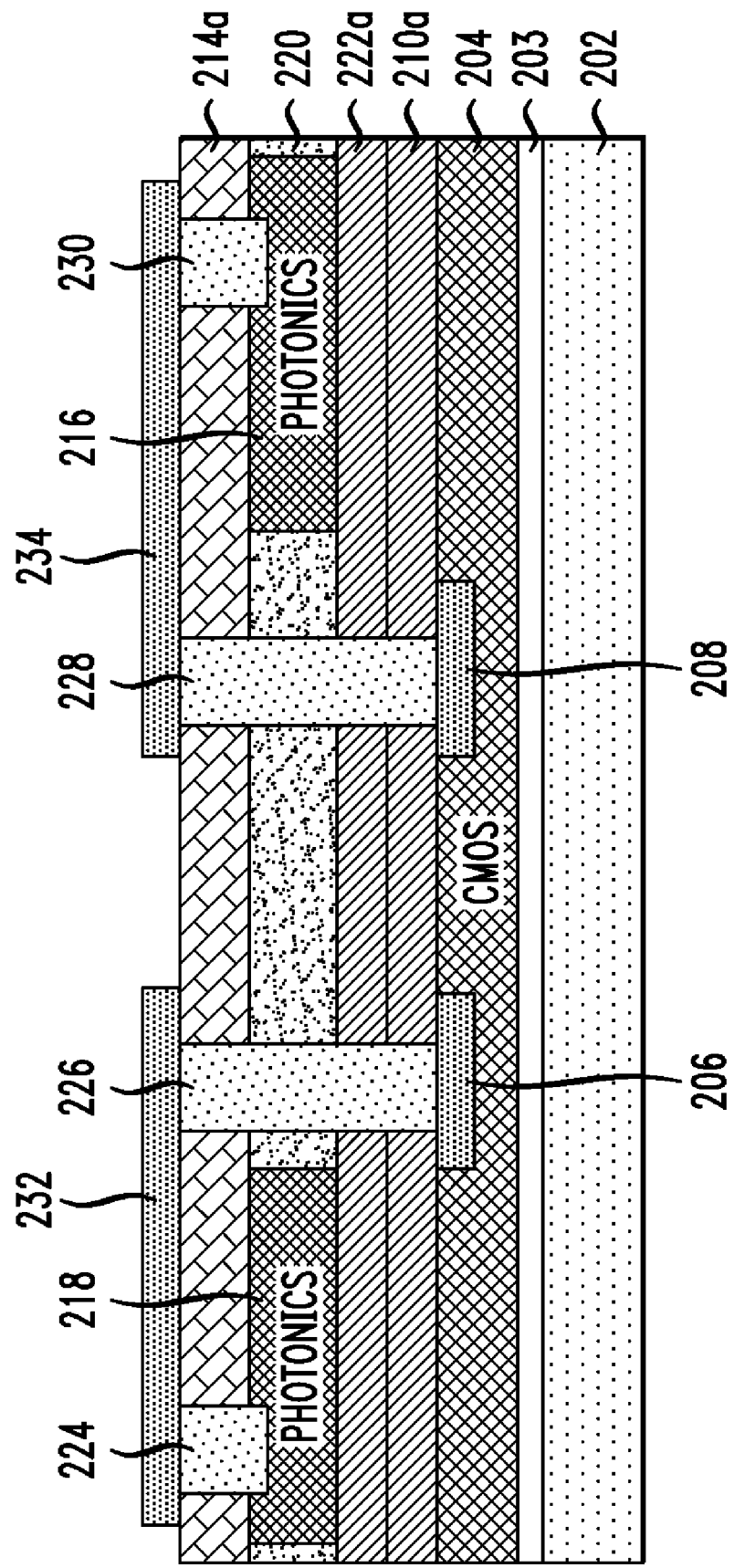

THREE-DIMENSIONAL INTEGRATED CIRCUITS AND TECHNIQUES FOR FABRICATION THEREOF

CROSS-REFERENCE TO RELATED APPLICATION(S)

This application is related to the commonly owned U.S. application Ser. No. 12/132,029, entitled "Techniques for Three-Dimensional Circuit Integration," filed herewith on the same day of Jun. 3, 2008, the contents of which are incorporated by reference herein.

FIELD OF THE INVENTION

The present invention relates to integrated circuits, and more particularly, to integrated circuits having complementary metal-oxide semiconductor (CMOS) and photonics circuitry and techniques for three-dimensional integration thereof.

BACKGROUND OF THE INVENTION

To address the scaling requirements of today's electronic devices, chip designers and manufacturers are constantly trying to devise circuit designs that best maximize available chip space. The resulting designs often extend to several different planes. For example, one such three-dimensional circuit design might involve a number of different device layers oriented in a stacked configuration.

When constructing a circuit in a stacked configuration it is a common practice to attach the device layers to one another using oxide-to-oxide bonding. For example, if there are two device layers involved, a handle wafer (commonly a glass wafer) is typically attached to one of the device layers and used to carry that device layer for oxide-to-oxide bonding with the other device layer. There are, however, drawbacks associated with this type of conventional three-dimensional fabrication process.

In the conventional process, each device layer is generally formed from a thin silicon-on-insulator (SOI) wafer on a substrate. The insulator, in this case an oxide, provides the basis for the oxide-to-oxide bond. Specifically, as described above, the handle wafer is attached to one of the device layers. The substrate is then removed from that device layer to expose the insulator (oxide), so as to permit the oxide-to-oxide bonding with the other device layer. Removal of the substrate is generally done by grinding or selective etching. These removal processes, however, can damage the exposed insulator (oxide). Any resulting surface unevenness and/or irregularities can negatively affect the quality of the subsequent oxide-to-oxide bond with the other device layer.

As such, there exists a need for improved three-dimensional integrated circuit integration techniques.

SUMMARY OF THE INVENTION

The present invention provides integrated circuits having complementary metal-oxide semiconductor (CMOS) and photonics circuitry and techniques for three-dimensional integration thereof. In one aspect of the invention, a three-dimensional integrated circuit is provided. The three-dimensional integrated circuit comprises a bottom device layer and a top device layer. The bottom device layer comprises a substrate; a digital CMOS circuitry layer adjacent to the substrate; and a first bonding oxide layer adjacent to a side of the digital CMOS circuitry layer opposite the substrate. The top device layer comprises an analog CMOS and photonics circuitry layer formed in a silicon-on-insulator (SOI) layer having a buried oxide (BOX) with a thickness of greater than or equal to about 0.5 micrometers; and a second bonding oxide layer adjacent to the analog CMOS and photonics circuitry layer. The bottom device layer is bonded to the top device layer by an oxide-to-oxide bond between the first bonding oxide layer and the second bonding oxide layer.

In another aspect of the invention, a method of fabricating a three-dimensional integrated circuit is provided. The method comprises the following steps. A bottom device layer is formed by the steps of: forming a digital CMOS circuitry layer adjacent to a first substrate and depositing a first bonding oxide layer over a side of the digital CMOS circuitry layer opposite the first substrate. A top device layer is formed by the steps of: forming an analog CMOS and photonics circuitry layer in a SOI layer adjacent to a second substrate, the SOI layer having a BOX with a thickness of greater than or equal to about one micrometer; and depositing a second bonding oxide layer over a side of the analog CMOS and photonics circuitry layer opposite the second substrate. An oxide-to-oxide bond is formed between the first bonding oxide layer and the second bonding oxide layer. The second substrate is removed from the top device layer so as to expose the BOX. A semiconductor optical amplifier can be provided and can be bonded to the analog CMOS and photonics circuitry layer.

In yet another aspect of the invention, another three-dimensional integrated circuit is provided. The three-dimensional integrated circuit comprises a bottom device layer and a top device layer. The bottom device layer comprises a substrate; a digital CMOS circuitry layer adjacent to the substrate; and a first bonding oxide layer adjacent to a side of the digital CMOS circuitry layer opposite the substrate. The top device layer comprises an analog CMOS and photonics circuitry layer formed in a SOI layer having a BOX with a thickness of greater than or equal to about 0.5 micrometers; at least one semiconductor optical amplifier bonded to the analog CMOS and photonics circuitry layer by an oxide-to-oxide bond; and a second bonding oxide layer adjacent to the analog CMOS and photonics circuitry layer. The bottom device layer is bonded to the top device layer by an oxide-to-oxide bond between the first bonding oxide layer and the second bonding oxide layer.

A more complete understanding of the present invention, as well as further features and advantages of the present invention, will be obtained by reference to the following detailed description and drawings.

BRIEF DESCRIPTION OF THE DRAWINGS

FIGS. 2A-L are cross-sectional diagrams illustrating another exemplary methodology for fabricating a three-dimensional integrated circuit according to an embodiment of the present invention;

DETAILED DESCRIPTION OF PREFERRED EMBODIMENTS

Figure 1:
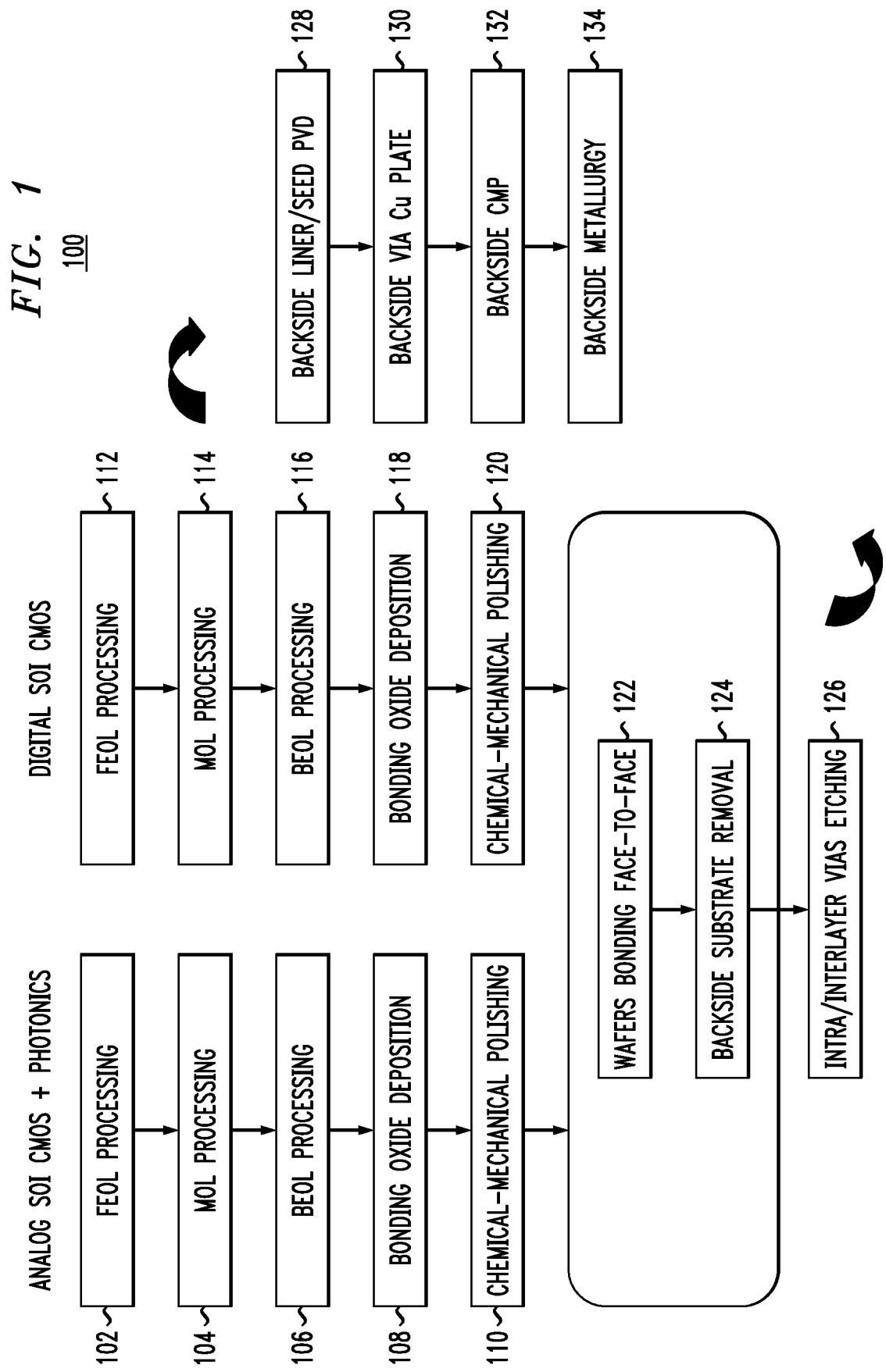
FIG. 1 is a diagram illustrating an exemplary methodology for fabricating a three-dimensional integrated circuit according to an embodiment of the present invention.

FIG. 1 is a diagram illustrating exemplary methodology 100 for fabricating a three-dimensional integrated circuit. Specifically, FIG. 1 provides an overview of a process whereby analog complementary metal-oxide semiconductor (CMOS) and photonics components (also referred to herein collectively as "analog CMOS/photonics circuitry"), fabricated on a common silicon-on-insulator (SOI) top wafer, are integrated with digital CMOS components (also referred to herein collectively as "digital CMOS circuitry") fabricated on a common SOI or bulk-silicon (Si) bottom wafer. The designations "top" and "bottom" refer to an orientation of the wafers/device layers (see below) relative to one another in the fabricated circuit, and will be used to identify the wafers/device layers throughout the fabrication process. Further, the top wafer with analog CMOS/photonics circuitry and related components/layers is referred to hereinafter as a "top device layer," and the bottom wafer with digital CMOS circuitry and related components/layers is referred to hereinafter as a "bottom device layer."

To begin the process, the top device layer and the bottom device layer are separately fabricated. See steps 102-110 and steps 112-120, respectively. Namely, in steps 102, 104 and 106 standard front-end-of-line (FEOL), middle-of-line (MOL) and back-end-of-line (BEOL) processes, respectively, are carried out to form the analog CMOS and photonics components in the top wafer. These processes will be described in further detail below. In general, however, the analog CMOS and photonics components are formed in an SOI layer over a, e.g., Si and/or a group III-V compound, such as gallium arsenide (GaAs), indium phosphide (InP), indium-gallium-arsenide (InGaAs) and/or indium-gallium-arsenide phosphide (InGaAsP), substrate, wherein the insulator, a buried oxide (BOX), is thick, i.e., has a thickness of greater than or equal to about one micrometer ($\mu m$), for example, greater than or equal to about two $\mu m$. Employing such a thick BOX in the top device layer provides a number of notable benefits. First, the thick BOX will protect the analog CMOS/photonics circuitry during subsequent substrate removal (see step 124, described below). Second, the thick BOX will minimize or eliminate interference of outside noise on the photonics components. Namely, a thick BOX will prevent waveguide mode leakage to the surrounding components. In step 108, a bonding oxide layer is deposited over the SOI layer. In step 110, chemical-mechanical polishing (CMP) is used to smooth the bonding oxide layer surface.

With regard to fabrication of the bottom device layer, in steps 112, 114 and 116, standard FEOL, MOL and BEOL processes, respectively, are carried out to form the digital CMOS components in the bottom wafer. These processes will also be described in further detail below. In general, however, the digital CMOS components are formed over a, e.g., Si, GaAs, silicon germanium (SiGe) and/or glass, substrate. The bottom wafer can be a bulk-Si wafer or an SOI wafer wherein the insulator is a BOX. According to an exemplary embodiment wherein the bottom wafer is a bulk-Si wafer, the digital CMOS components are formed in a top portion of the bulk-Si wafer. The remainder of the bulk-Si wafer below the top portion containing the digital CMOS components is designated herein as the (Si) substrate. In step 118, a bonding oxide layer is deposited over the bottom wafer. In step 120, CMP is used to smooth the bonding oxide layer surface.

In step 122, the top device layer and the bottom device layer are bonded together face-to-face, wherein an oxide-to-oxide bond is formed between the bonding oxide layer of the top device layer and the bonding oxide layer of the bottom device layer (see, for example, steps 108 and 118, respectively, described above). This process involves flipping the top device layer to align its bonding oxide layer (i.e., its 'face') with the bonding oxide layer (i.e., the 'face') of the bottom device layer. By comparison, in conventional oxide-to-oxide wafer bonding, as described above, it is generally a BOX that serves as the oxide interface for the top device layer. Thus, in conventional schemes face-to-face bonding is not used. As will be described in detail below, this distinction is notable since one drawback of conventional processes is that the BOX is sometimes too thin to produce a good, reliable result.

In step 124, the substrate is removed from the top device layer using, for example, grinding, CMP or deep reactive ion etching (RIE). As described above, the thick BOX of the top wafer prevents the analog CMOS/photonics circuitry from being affected during this substrate removal step. Namely, since the substrate removal process involves either dry or wet etching, when the BOX has enough thickness, the oxide becomes a good etch stop layer. Thus, the device layer underneath the oxide can be protected. For a standard BOX thickness it is difficult to prevent destruction of the oxide and/or the devices underneath the oxide.

As a result of the substrate removal step, the BOX of the top wafer may be slightly thinned (e.g., by up to about 50 percent (%)), to a thickness of greater than or equal to about 0.5 $\mu m$, e.g., greater than or equal to about one $\mu m$. This substrate removal step is shown pictorially in FIG. 2I (described below).

In step 126, etching is used to form one or more intra-layer vias and/or one or more inter-layer vias in the circuit. One or more of these vias can be through Si vias (TSVs), e.g., extending through the Si substrate of the top device layer or the bottom device layer. Intra-layer and inter-layer vias are described in detail below. In step 128, backside liner/seed deposition is performed, e.g., by physical vapor deposition (PVD), to form a diffusion barrier comprising, e.g., titanium nitride (TiN), an adhesion layer comprising, e.g., titanium (Ti), and a seed layer comprising, e.g., copper (Cu) in the vias. The seed layer is used for subsequent metal deposition into the vias (see step 130, described below).

In step 130, the vias formed in step 126 (described above) are filled with a metal, e.g., tungsten (W) or Cu, using a backside plating or other suitable metal deposition technique, to form conductive vias. The term "backside," as used herein refers to a side of the device layer opposite its face (i.e., opposite the bonding oxide layer). For example, the backside of the top device layer is the side of the top device layer from which the substrate was removed (see step 124 (described above)). In step 132, the metal is then planed using, e.g., CMP. Techniques for forming vias are presented, for example, in Andry et al., "A CMOS-Compatible Process for Fabricating Electrical Through-Vias in Silicon," 56th ECTC (2006) (an annular via process); Patel et al., "Silicon Carrier With Deep Through-Vias, Fine Pitch Wiring and Through Cavity for Parallel Optical Transceiver," 55th ECTC (2005) (a vias-first approach) and Knickerbocker et al., "Development of Next- Generation System-on-Package (SOP) Technology Based on Silicon Carriers With Fine-Pitch Chip Interconnection," IBM J. Res. Develop., vol. 49 (2005) (a vias-last approach), the contents of each of which are incorporated by reference herein. In step 134, application-specific metallurgy is formed on the backside of the top or bottom device layers. Further, as will be described in detail below, one or more intra-layer conductive vias and/or inter-layer conductive vias may be formed during the fabrication of the top and/or bottom device layers, i.e., prior to the device layers being bonded together.

FIGS. 2A-L are cross-sectional diagrams illustrating another exemplary methodology for fabricating a three-dimensional integrated circuit. Namely, FIGS. 2A-L provide a pictorial representation of the fabrication process outlined in FIG. 1, and described above. In FIG. 1 the top device layer is formed before the bottom device layer. As will be described below, in FIGS. 2A-L the bottom device layer is formed before the top device layer. The particular sequence, i.e., top device layer first or bottom device layer first, is immaterial and during large-scale manufacturing it is likely that a number of top and bottom device layers will be pre-fabricated prior to assembly.

FIGS. 2A-C illustrate the formation of the bottom device layer. According to an exemplary embodiment, the bottom device layer is formed from a bulk-Si or an SOI wafer and comprises digital CMOS circuitry. FIGS. 2A-C depict the option of forming the bottom device layer from an SOI layer having a BOX 203. As shown in FIG. 2A, a digital CMOS circuitry layer, i.e., digital CMOS circuitry layer 204, is formed in the SOI layer, i.e., in the silicon over the insulator, adjacent to substrate 202. Digital CMOS circuitry layer 204 is formed using standard CMOS processing methods. Digital CMOS circuitry layer 204 comprises digital CMOS components such as digital CMOS logic components.

Metal pads 206 and 208 are then formed in digital CMOS circuitry layer 204. According to an exemplary embodiment, metal pads 206 and 208 each comprise Cu and are formed by first patterning the digital CMOS circuitry layer with the footprint and location of each metal pad and then filling the pattern with the metal, i.e., Cu. The metal can be planed to the surface of the digital CMOS circuitry layer, e.g., using CMP. Alternatively, a mask (not shown) can be deposited on the digital CMOS circuitry layer and patterned with the footprint and location of each metal pad. The pattern can be filled with the metal, i.e., Cu, and the mask removed. In that instance, the metal pads will be formed on top of digital CMOS circuitry layer 204. This configuration is shown, for example, in FIG. 3. One or more intra-layer conductive vias (not shown) can be formed in digital CMOS circuitry layer 204 connecting metal pads 206 and 208 to specific digital CMOS components present in digital CMOS circuitry layer 204. This configuration is shown detailed in FIG. 3. The term "intra-layer conductive via," as used herein, refers to a conductive via that forms connections within one of the circuitry layers, i.e., within digital CMOS circuitry layer 204 or within analog CMOS/photonics circuitry layer 220 (see below). By comparison, the term "inter-layer conductive via," as used herein, refers to a conductive via that forms connections between the circuitry layers, i.e., between digital CMOS circuitry layer 204 and analog CMOS/photonics circuitry layer 220.

As shown in FIG. 2B, bonding oxide layer 210 is deposited over digital CMOS circuitry layer 204/metal pads 206 and 208. According to an exemplary embodiment, bonding oxide layer 210 is deposited by chemical vapor deposition (CVD) to a thickness of from about 500 angstroms (Å) to about five µm. As shown in FIG. 2C, the surface of bonding oxide layer 210 is then smoothed using, e.g., CMP. This process will reduce the thickness of the bonding oxide layer, for example, by up to about 50%, resulting in bonding oxide layer 210a. A smooth surface is helpful for oxide bonding since the number of contact points that can be achieved between the bonding oxide layers during face-to-face bonding (see below) is higher.

Figure 2E:
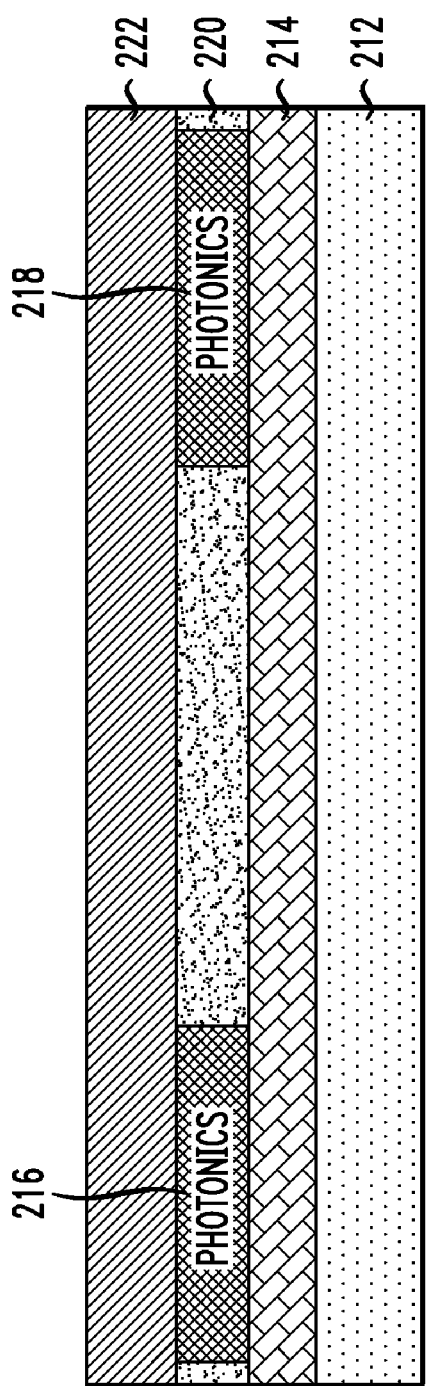
Figure 2F:
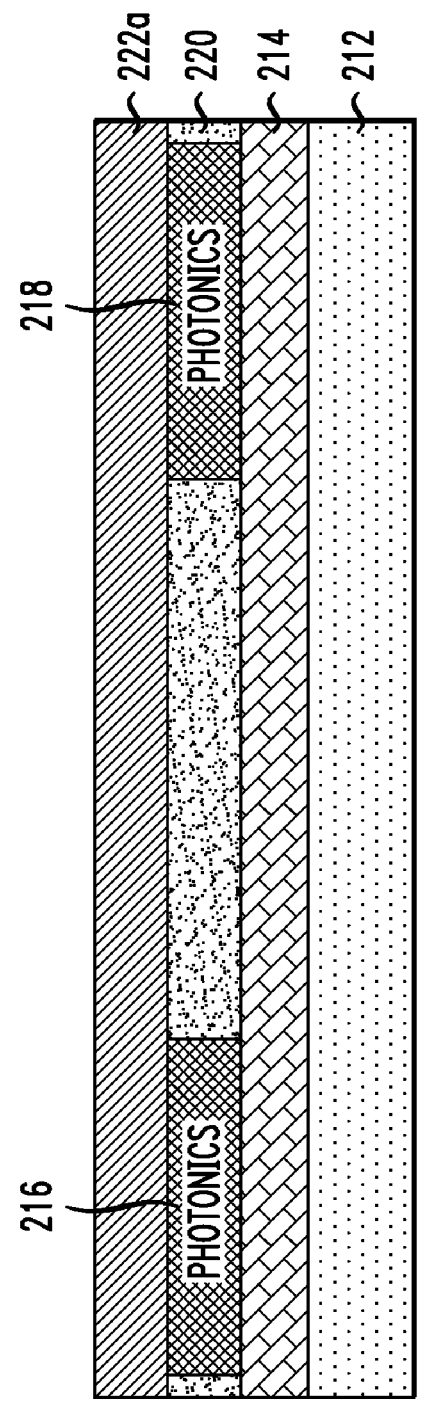

FIGS. 2D-F illustrate the formation of the top device layer. According to an exemplary embodiment, the top device layer is formed in a thick SOI layer and comprises analog CMOS/photonics circuitry. Namely, as shown in FIG. 2D, an analog CMOS/photonics circuitry layer, i.e., analog CMOS/photonics circuitry layer 220, is formed in the thick SOI layer, i.e., in the silicon over the insulator, adjacent to substrate 212.

The term "thick" refers to the fact that the SOI layer has a BOX 214 with a thickness of greater than or equal to about one µm, e.g., greater than or equal to about two µm. As described above, employing a thick BOX in the top device layer will protect the analog CMOS/photonics circuitry during subsequent substrate removal (see, for example, FIG. 2I, described below) and/or will minimize or eliminate interference of outside noise on the photonics components, e.g., waveguide mode leakage to the surrounding components. Analog CMOS/photonics circuitry layer 220 is formed in the thick SOI layer using standard CMOS processing steps. Analog CMOS/photonics circuitry layer 220 comprises analog CMOS components, such as analog modulators, analog drivers and/or analog transimpedance amplifiers (TIAs), and photonics components, such as optical waveguides, optical detectors, switches and/or optical couplers. The analog CMOS components can be configured as a voltage source for the photonics circuitry. Further, the photonics components can be grouped into one or more photonics block modules, e.g., photonics block modules 216 and 218. Alternatively, each analog CMOS and photonics component can be placed, individually, in the analog CMOS/photonics circuitry layer. See, for example, FIG. 3.

Optionally, one or more metal pads (not shown) may be formed in analog CMOS/photonics circuitry layer 220. See, for example, FIG. 3 (described below). The formation of metal pads was described, for example, in conjunction with the description of FIG. 2A, above. One or more intra-layer conductive vias (not shown) can be formed in analog CMOS/photonics circuitry layer 220 connecting the metal pads to specific analog CMOS and/or photonics components present in analog CMOS/photonics circuitry layer 220. This configuration is shown detailed in FIG. 3.

As shown in FIG. 2E, bonding oxide layer 222 is deposited over analog CMOS/photonics circuitry layer 220. As with bonding oxide layer 210 (described above), bonding oxide layer 222 can be deposited by CVD to a thickness of from about 500 Å to about five µm. As shown in FIG. 2F, the surface of bonding oxide layer 222 is then smoothed using, e.g., CMP. This process will reduce the thickness of the bonding oxide layer, e.g., by up to about 50%, resulting in bonding oxide layer 222a.

Figure 2G:
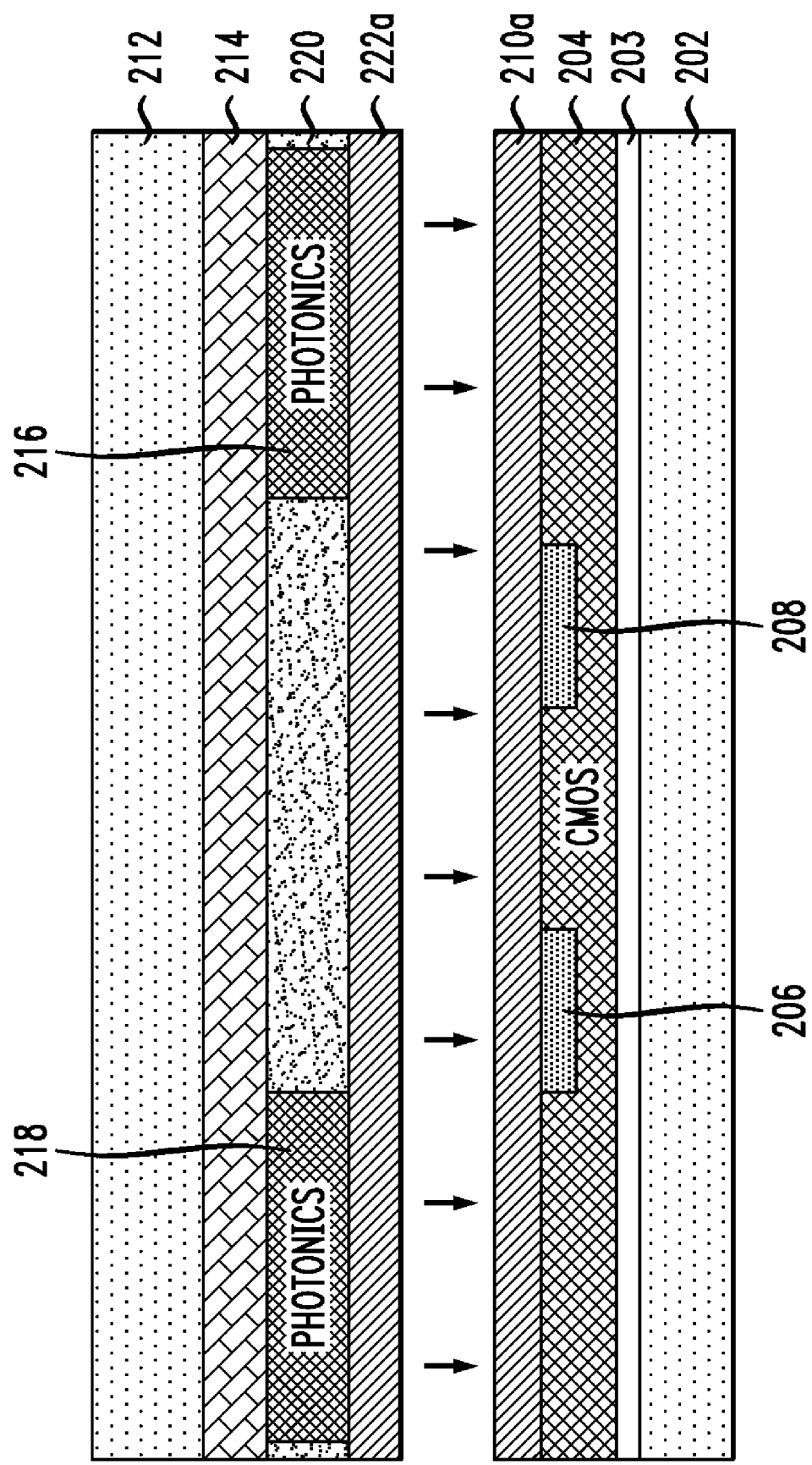

As shown in FIG. 2G, the top device layer is flipped so as to permit face-to-face bonding of the top and bottom device layers, i.e., an oxide-to-oxide bond is formed between bonding oxide layer 210a (bottom device layer) and bonding oxide layer 222a (top device layer). According to an exemplary embodiment, the bonding process is performed by pressing the bonding oxide layers together (i.e., face-to-face) at room temperature with a force initiating from a center contacting area. The contacting area will expand from the center outward across the layers. Thereafter, a thermal anneal at 280 degrees Celsius (° C.) for greater than about 12 hours, e.g., for about 24 hours, is required to enforce the bonding quality. The bonded device layers are shown in FIG. 2H.

As shown in FIG. 2I, substrate 212 is removed. Substrate 212 can be removed selectively from BOX 214 using grinding, CMP and/or deep RIE. As highlighted above, the BOX might be slightly thinned (e.g., by up to about 50%) during the substrate removal process, thus resulting in BOX 214a. While slightly thinned, the BOX is still thick enough (due to its starting thickness) to protect the devices underneath. Thus the thickness of the BOX serves to protect the analog CMOS/photonics circuitry during this substrate removal process.

Figure 2J:
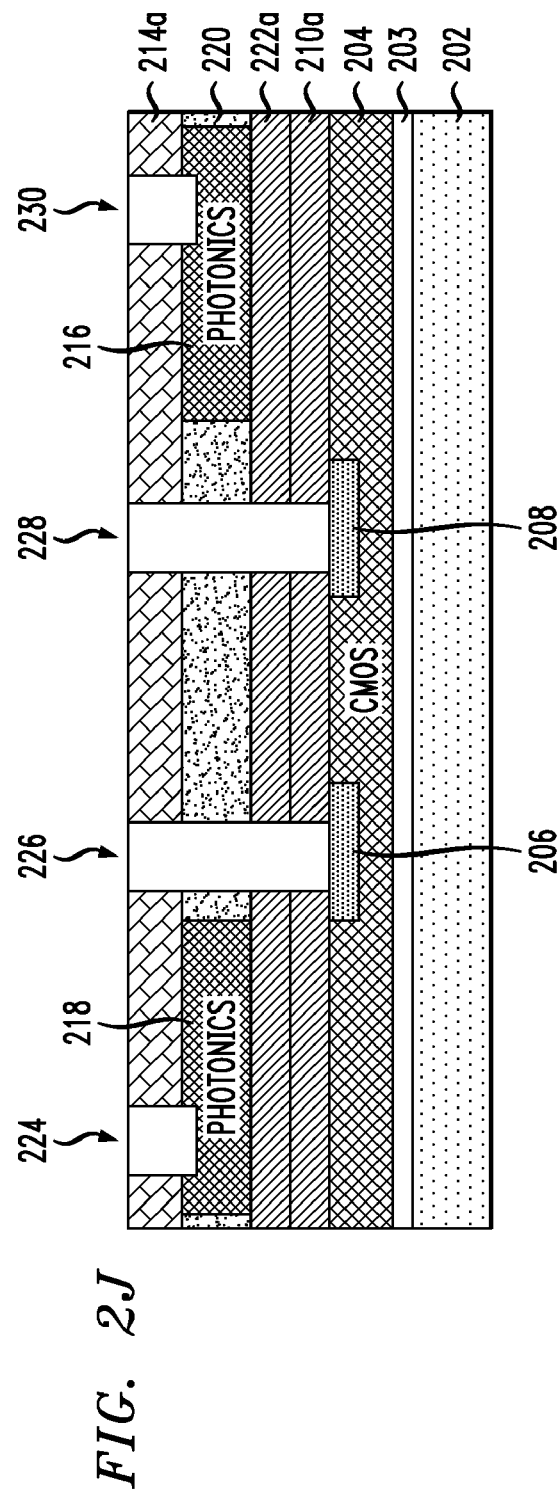

As shown in FIG. 2J, vias are formed in the three-dimensional integrated circuit. Namely, vias 224 and 230 are formed through BOX 214a, and vias 226 and 228 are formed through BOX 214a/analog CMOS/photonic circuitry layer 220/bonding oxide layers 210a and 222a. According to an exemplary embodiment, vias 224, 226, 228 and 230 are formed using photolithography, wherein a photoresist is deposited over BOX 214a, masked and patterned with the vias. A deep RIE is then used to form vias 224/230 and vias 226/228 with photonics block modules 218/216 and metal pads 206/208, respectively, acting as etch stops. Backside liner/seed deposition can then be performed to form a diffusion barrier, an adhesion layer and a seed layer in the vias (as described above).

Figure 2K:
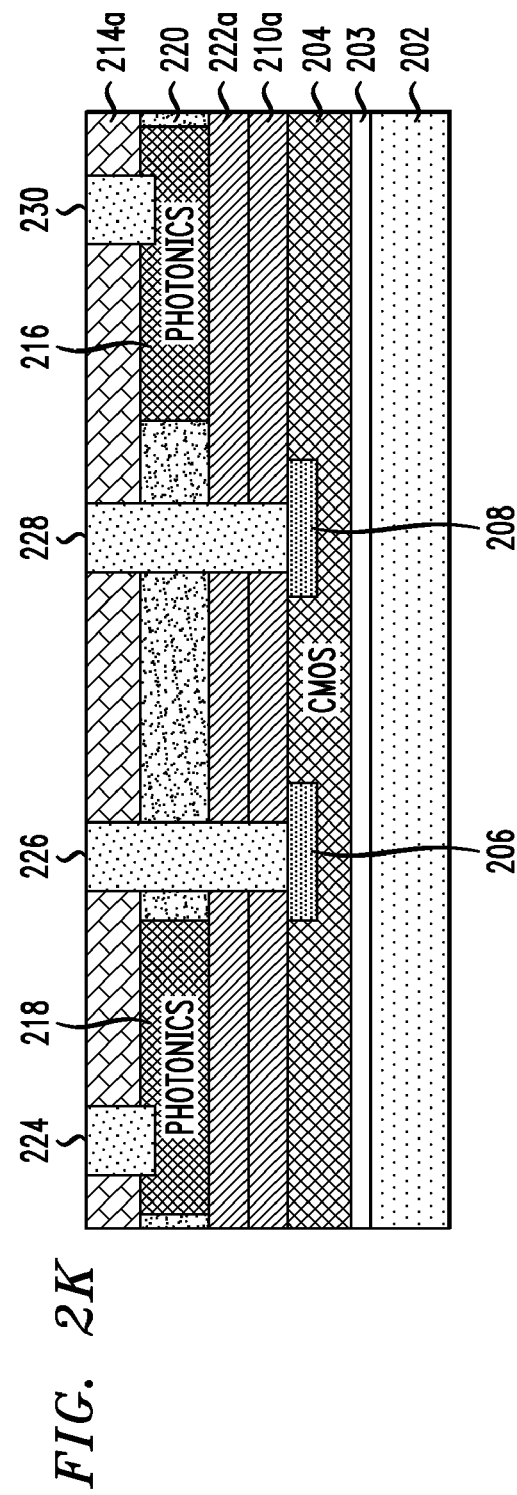

As shown in FIG. 2K, each of vias 224, 226, 228 and 230, formed above, are filled with a metal such as one or more of W and Cu to form conductive vias. As such, conductive via 224 will be in contact with photonics block module 218, conductive via 226 will be in contact with metal pad 206, conductive via 228 will be in contact with metal pad 208 and conductive via 230 will be in contact with photonics block module 216. CMP can be used to plane the metal to the surface of BOX 214a. In the configuration shown in FIG. 2K, conductive vias 224, 226, 228 and 230 are all inter-layer conductive vias in that conductive vias 224, 226, 228 and 230 (in conjunction with metal pads 232 and 234 (see description of FIG. 2L, below)) serve to interconnect the digital CMOS circuitry layer and the analog CMOS and photonics circuitry layer.

As shown in FIG. 2L, top metal pads 232 and 234 are formed over BOX 214a. As described above, top metal pads 232 and 234, in conjunction with conductive vias 224, 226, 228 and 230 serve to interconnect the digital CMOS circuitry layer and the analog CMOS and photonics circuitry layer. Namely, top metal pads 232 and 234 are in contact with conductive vias 224/226 and 228/230, respectively. As such, by way of the conductive vias, top metal pad 232 is in contact with both metal pad 206 and photonics block module 218, and top metal pad 234 is in contact with both metal pad 208 and photonics block module 216. According to an exemplary embodiment, top metal pads 232 and 234 are formed using a dual damascene process wherein a dielectric layer (not shown), e.g., an oxide layer, is deposited over BOX 214a. The dielectric layer is patterned with the top metal pads and the pattern filled with a conductive metal, such as Cu. CMP can be used to plane the metal to the surface of the dielectric layer. The dielectric layer can then be removed.

The above-described techniques can be used to fabricate a variety of different three-dimensional integrated circuit configurations that incorporate both digital CMOS and analog CMOS/photonics circuitry. See, for example, FIG. 3, described below. Further, the above-described techniques can be applied to a variety of different material systems. See, for example, FIGS. 4A-C, 5A-D and 6A-C, described below, wherein, e.g., InP-based, semiconductor optical amplifiers and fiber couplers are integrated into different three-dimensional circuit configurations.

Figure 3:
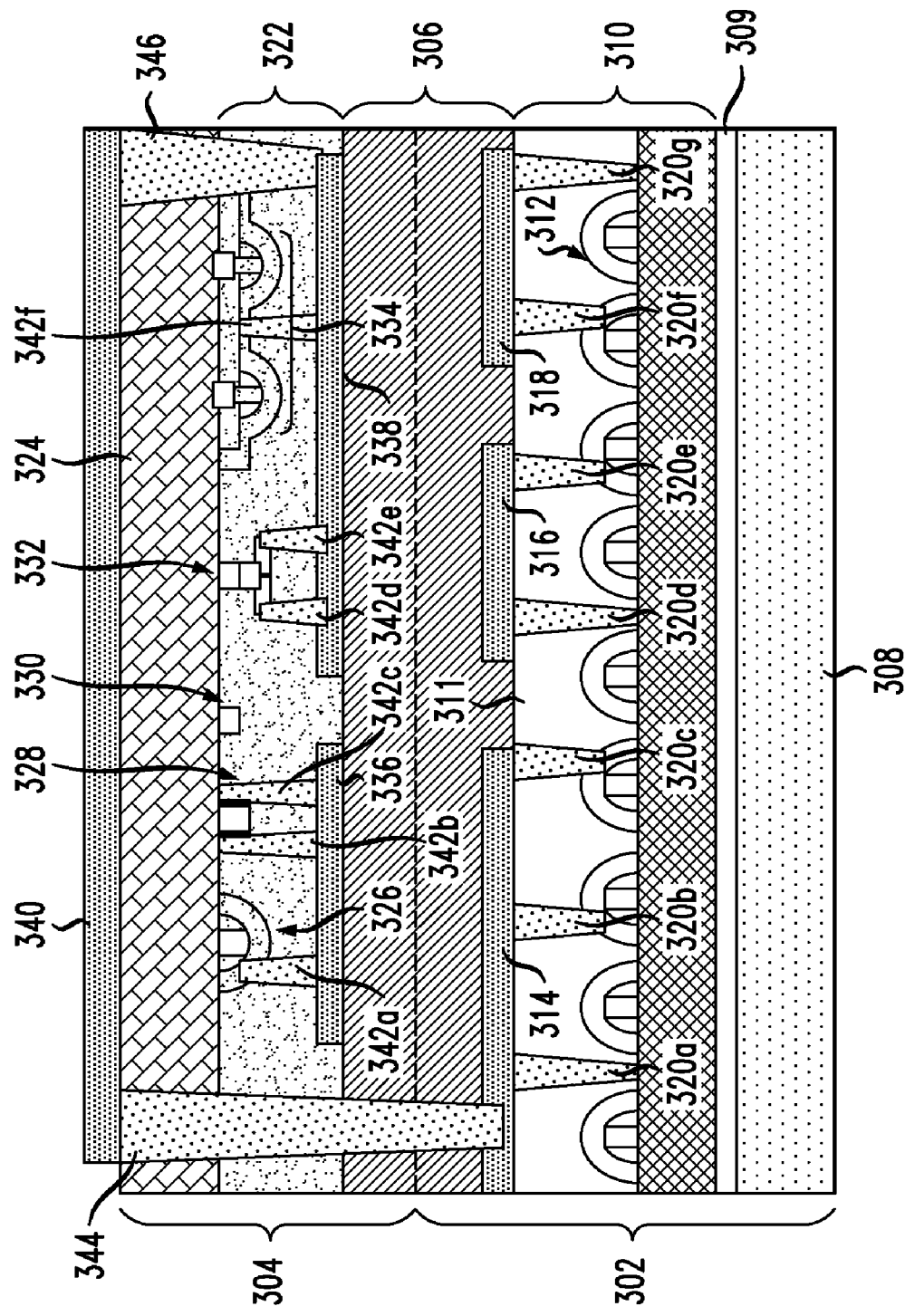
FIG. 3 is a cross-sectional diagram illustrating an exemplary three-dimensional integrated circuit configuration according to an embodiment of the present invention.

FIG. 3 shows one exemplary three-dimensional integrated circuit configuration that can be fabricated using the methodologies described in conjunction with the descriptions of FIG. 1 and FIGS. 2A-L, above. FIG. 3 is a cross-sectional diagram illustrating exemplary three-dimensional integrated circuit 300. Integrated circuit 300 represents the union, e.g., by way of face-to-face oxide-to-oxide bonding, of two device layers, i.e., a bottom device layer and a top device layer. For illustrative purposes, the bottom device layer and the top device layer are shown labeled in FIG. 3, i.e., bottom device layer 302 and top device layer 304. However, the following description is directed to these device layers as having been integrated together to form a common three-dimensional integrated circuit.

Integrated circuit 300 comprises a, e.g., Si, GaAs, SiGe and/or glass, substrate 308, a SOI layer adjacent to substrate 308 having BOX 309, digital CMOS circuitry layer 310 formed in the SOI layer, analog CMOS/photonics circuitry layer 322, formed in a thick SOI layer having BOX 324 and bonded oxide layer 306 between digital CMOS circuitry layer 310 and analog CMOS/photonics circuitry layer 322.

Digital CMOS circuitry layer 310 comprises digital CMOS components 312, e.g., digital logic CMOS components. In the configuration shown depicted in FIG. 3, digital CMOS circuitry layer 310 comprises digital CMOS components 312 formed over the SOI layer and covered by an oxide layer, i.e., oxide layer 311. This configuration is merely exemplary, and other configurations of the digital CMOS circuitry layer are possible. It is also notable that while, for ease of depiction, the digital CMOS circuitry layer is depicted in one or more other embodiments described herein as being integrated into a single layer (see, for example, FIGS. 2A-C) these embodiments are meant to encompass digital CMOS circuitry layer configurations that comprise multiple layers, such as in FIG. 3.

Metal pads 314, 316 and 318 are present over digital CMOS circuitry layer 310. Metal pads 314, 316 and 318 are connected to one or more of the digital CMOS components 312 by way of intra-layer conductive vias 320a-g. Metal pad 314, metal pad 316 and/or metal pad 318 can serve as a connection point between the two device layers, i.e., when coupled with an inter-layer conductive via (see below).

Bonded oxide layer 306 is formed from the union of corresponding oxide layers of the bottom and top device layers, as was described above. This oxide-to-oxide bond is formed in a face-to-face bonding orientation. It is important to keep in mind when viewing integrated circuit 300 that the top device layer is flipped during fabrication so as to permit face-to-face bonding with the bottom device layer (see description above).

Analog CMOS/photonics circuitry layer 322 comprises a number of analog CMOS and photonics components. In the exemplary embodiment shown illustrated in FIG. 3, analog CMOS/photonics circuitry layer 322 comprises analog driver 326, analog modulator 328, optical waveguide 330, optical detector 332 and analog TIA 334. Metal pads 336 and 338 are present within analog CMOS/photonics circuitry layer 322 adjacent to bonded oxide layer 306. Metal pads 336 and 338 are connected to one or more of the analog CMOS and/or photonics components by way of intra-layer conductive vias 342a-f. Metal pad 336 and/or metal pad 338 can serve as a connection point between the two circuitry layers, i.e., when coupled with an inter-layer conductive via.

BOX 324 has a thickness of greater than or equal to about 0.5 µm, e.g., greater than or equal to about one µm (after having been slightly thinned during the substrate removal process, see above). Employing such a thick BOX in the top device layer protects the analog CMOS/photonics circuitry during fabrication, e.g., during substrate removal (see description above) and/or minimizes or eliminates interference of outside noise on the photonics components, as described above.

Metal pad 340 is present on BOX 324. Metal pad 340 is connected to digital CMOS circuitry layer 310 by way of inter-layer conductive via 344 and to analog CMOS/photonics circuitry layer 322 by way of inter-layer conductive via 346. Therefore, inter-layer conductive vias 344 and 346 serve to interconnect the device/circuit layers.

Figure 4A:
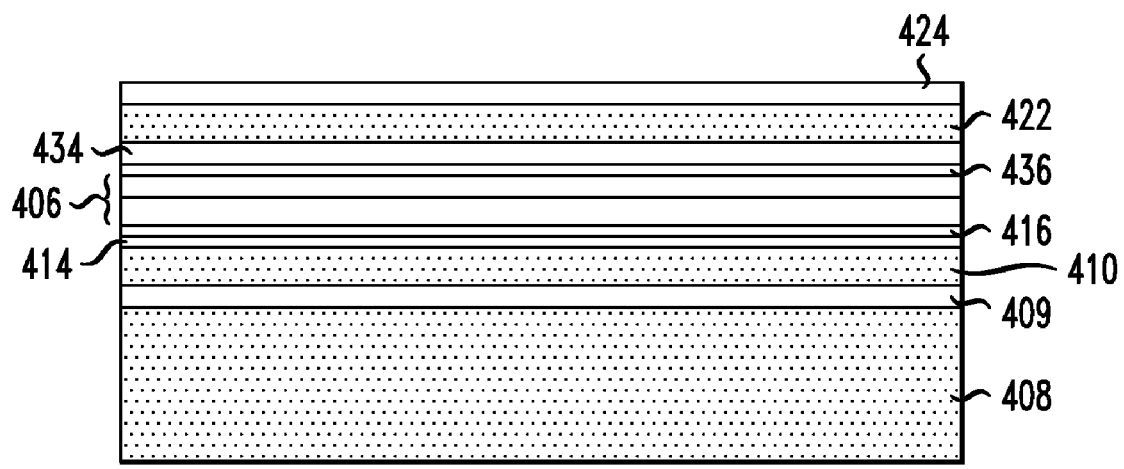
FIGS. 4A-C are cross-sectional diagrams illustrating yet another exemplary methodology for fabricating a three-dimensional integrated circuit according to an embodiment of the present invention.
Figure 4B:
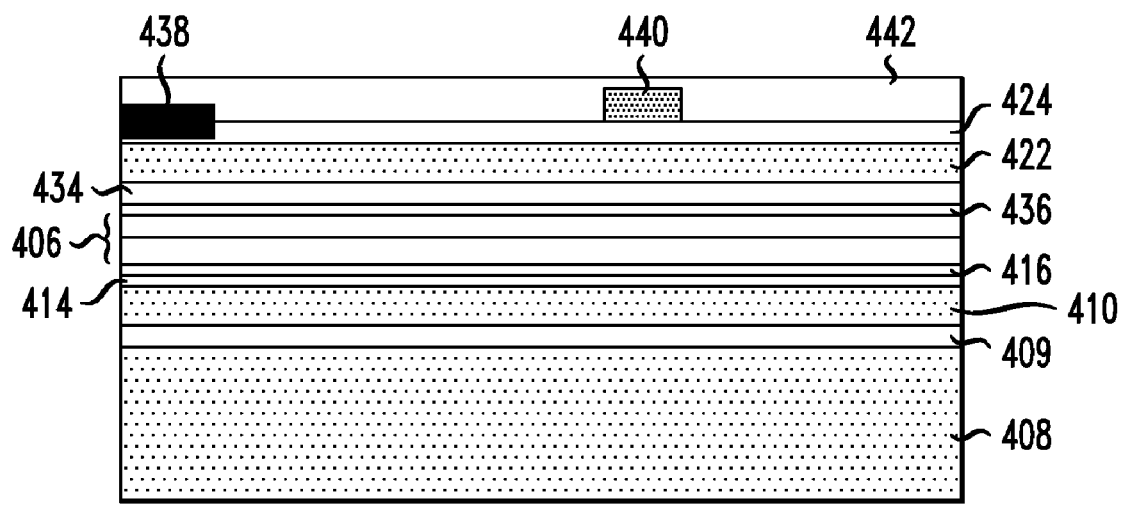
Figure 4C:
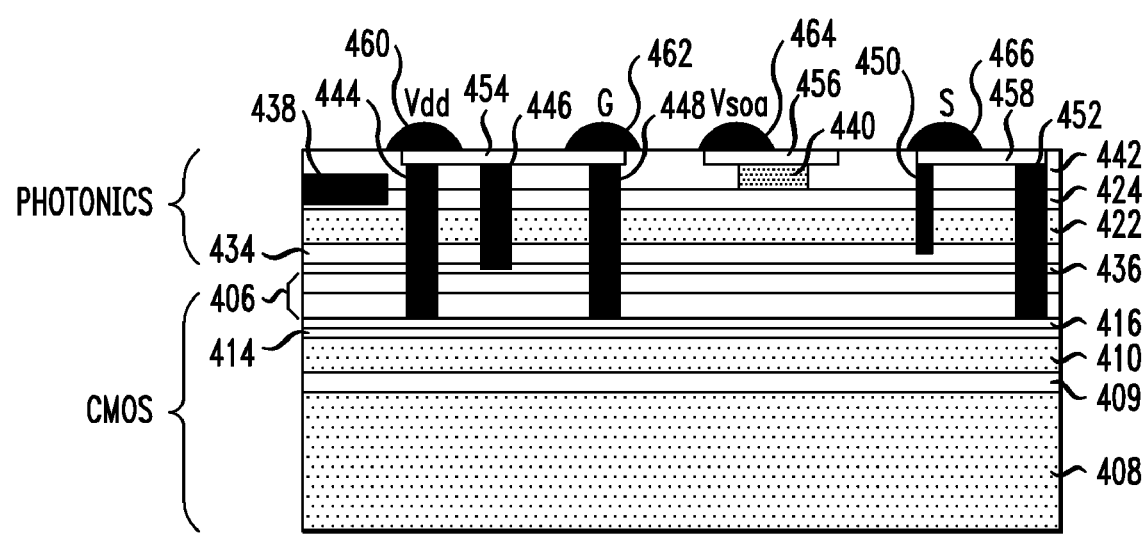

FIGS. 4A-C are cross-sectional diagrams illustrating yet another exemplary methodology for fabricating a three-dimensional integrated circuit. FIG. 4A illustrates an integrated circuit fabricated using the methodologies described in conjunction with the descriptions of FIG. 1 and FIGS. 2A-L, above. As such, the integrated circuit comprises a, e.g., Si, GaAs, SiGe and/or glass, substrate 408, a SOI layer adjacent to substrate 408 having BOX 409, digital CMOS circuitry layer 410 formed in the SOI layer, analog CMOS/photonics circuitry layer 422, formed in a thick SOI layer having BOX 424 and bonded oxide layer 406 between digital CMOS circuitry layer 410 and analog CMOS/photonics circuitry layer 422.

Digital CMOS circuitry layer 410 comprises digital CMOS components, e.g., digital logic CMOS components. Digital CMOS circuitry layer 410 has a metal layer, i.e., metal layer 416, associated therewith. While metal layer 416, for ease of depiction, is shown as a single, solid layer, metal layer 416 may in fact comprise a number of individual metal pads, such as metal pads 314, 316 and 318, e.g., in FIG. 3. Metal layer 416 is separated from digital CMOS circuitry layer 410 by insulating layer 414 (e.g., an oxide layer). Any suitable deposition techniques can be employed to form insulating layer 414 prior to metal layer 416, i.e., during the formation of the bottom device layer. Metal layer 416 is connected to one or more of the digital CMOS components by way of intra-layer conductive vias (not shown). Metal layer 416 serves as a connection point between the two device layers, i.e., when coupled with an inter-layer conductive via(s) (see below).

Bonded oxide layer 406 is formed from the union of corresponding oxide layers of the bottom and top device layers, as was described above. This oxide-to-oxide bond is formed in a face-to-face bonding orientation. It is important to keep in mind when viewing FIG. 4A that the top device layer is flipped during fabrication so as to permit face-to-face bonding with the bottom device layer (see description above).

Analog CMOS/photonics circuitry layer 422 comprises analog CMOS and photonics components, such as analog modulators, analog drivers, analog TIAs, optical waveguides, optical detectors, switches and optical couplers. Analog CMOS/photonics circuitry layer 422 has a metal layer, i.e., metal layer 436, associated therewith. While metal layer 436, for ease of depiction, is shown as a single, solid layer, metal layer 436 may in fact comprise a number of individual metal pads, such as metal pads 336 and 338, e.g., in FIG. 3. Metal layer 436 is separated from analog CMOS/photonics circuitry layer 422 by insulating layer 434 (e.g., an oxide layer). Any suitable deposition techniques can be employed to form insulating layer 434 prior to metal layer 436, i.e., during the formation of the top device layer. Metal layer 436 is connected to one or more of the analog CMOS/photonics components by way of intra-layer conductive vias (not shown).

Metal layer 436 serves as a connection point between the two device layers, i.e., when coupled with an inter-layer conductive via(s) (see below).

During the substrate removal from the top device layer, as described above, BOX 424 may be thinned from its original thickness of, i.e., greater than or equal to about one μm, e.g., greater than or equal to about two μm, to greater than or equal to about 0.5 μm, e.g., greater than or equal to about one μm, respectively. BOX 424 will serve as a platform for integrating a semiconductor optical amplifier in the integrated circuit (see FIG. 4B, described below).

As shown in FIG. 4B, semiconductor optical amplifier 440 is integrated in the circuit. According to an exemplary embodiment, a preformed semiconductor optical amplifier unit is provided comprising semiconductor optical amplifier 440 over a (e.g., group III-V compound, such as InP) substrate. An oxide layer (not shown) is then deposited on semiconductor optical amplifier 440. An oxide layer (not shown) may also be deposited on BOX 424. Semiconductor optical amplifier 440 is then bonded to BOX 424 by way of an oxide-to-oxide bond, e.g., between the oxide layer on semiconductor optical amplifier 440 and the oxide layer on BOX 424 (or directly to BOX 424). Oxide-to-oxide bonding was described in detail above. By way of example only, the oxide layer can be deposited on a side of semiconductor optical amplifier 440 opposite the substrate, and the semiconductor optical amplifier unit flipped for bonding to BOX 424. The semiconductor optical amplifier substrate can then be removed, e.g., using CMP.

As shown in FIG. 4B, a fiber coupler, i.e., fiber coupler 438, is also formed in the top device layer. Fiber couplers and techniques for the formation thereof are described in detail, for example, in U.S. application Ser. No. 12/164,580, filed on Jun. 30, 2008, now U.S. Pat. No. 7,738,753, the contents of which are incorporated by reference herein. Oxide layer 442 is then deposited over BOX 424/semiconductor optical amplifier 440/fiber coupler 438.

As shown in FIG. 4C, conductive vias 444, 446, 448, 450 and 452 are formed. The formation of conductive vias was described in detail above. Conductive vias 444, 446, 448, 450 and 452 are inter-layer conductive vias, connecting the top and bottom device layers. Metal pads 454, 456 and 458 are formed in oxide layer 442. The formation of metal pads was described in detail above. As shown in FIG. 4C, one or more of the metal pads are in contact with one or more of the conductive vias.

It is to be understood that the integrated circuit shown illustrated in FIG. 4C represents the union, e.g., by way of face-to-face oxide-to-oxide bonding, of the two device layers, i.e., the bottom device layer and the top device layer. For illustrative purposes, the bottom device layer and the top device layer are shown labeled in FIG. 4C, i.e., the bottom device layer labeled "CMOS" (to indicate that the bottom device layer comprises digital CMOS circuitry, as described above) and the top device layer labeled "Photonics" (to indicate that the top device layer comprises analog CMOS/photonics circuitry, as described above). However, the following description is directed to these device layers as having been integrated together to form a common three-dimensional integrated circuit.

Contacts, i.e., solder bumps, 460 and 462/464/466 are formed over metal pads 454/456/458, respectively. As shown in FIG. 4C, contact 460 acts a power contact to the analog CMOS/photonics components and/or digital CMOS components (labeled "Vdd"), contact 462 acts as a ground contact (labeled "G"), contact 464 acts as a power contact to the semiconductor optical amplifier (labeled "Vsoa") and contact 466 acts a source contact (labeled "S").

Figure 5A:
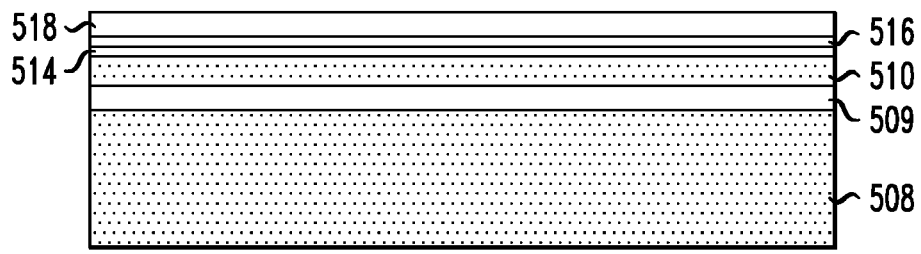
FIGS. 5A-D are cross-sectional diagrams illustrating still yet another exemplary methodology for fabricating a three-dimensional integrated circuit according to an embodiment of the present invention.

FIGS. 5A-D are cross-sectional diagrams illustrating still yet another exemplary methodology for fabricating a three-dimensional integrated circuit. FIG. 5A illustrates a bottom device layer fabricated using the methodologies described in conjunction with the descriptions of FIG. 1 and FIGS. 2A-L, above. As such, the bottom device layer comprises a, e.g., Si, GaAs, SiGe and/or glass, substrate 508, a SOI layer adjacent to substrate 508 having BOX 509, digital CMOS circuitry layer 510 formed in the SOI layer and bonding oxide layer 518 over a side of digital CMOS circuitry layer 510 opposite BOX 509. Bonding oxide layer 518 will, as described above, be used in forming an oxide-to-oxide bond with a corresponding bonding oxide layer on the top device layer.

Digital CMOS circuitry layer 510 comprises digital CMOS components, e.g., digital logic CMOS components. Digital CMOS circuitry layer 510 has a metal layer, i.e., metal layer 516, associated therewith. While metal layer 516, for ease of depiction, is shown as a single, solid layer, metal layer 516 may in fact comprise a number of individual metal pads, such as metal pads 314, 316 and 318, e.g., in FIG. 3. Metal layer 516 is separated from digital CMOS circuitry layer 510 by insulating layer 514 (e.g., an oxide layer). Any suitable deposition techniques can be employed to form insulating layer 514 prior to metal layer 516, i.e., during the formation of the bottom device layer. Metal layer 516 is connected to one or more of the digital CMOS components by way of intra-layer conductive vias (not shown). Metal layer 516 serves as a connection point between the two device layers in the completed circuit, i.e., when coupled with an inter-layer conductive via(s) (see below).

Figure 5B:
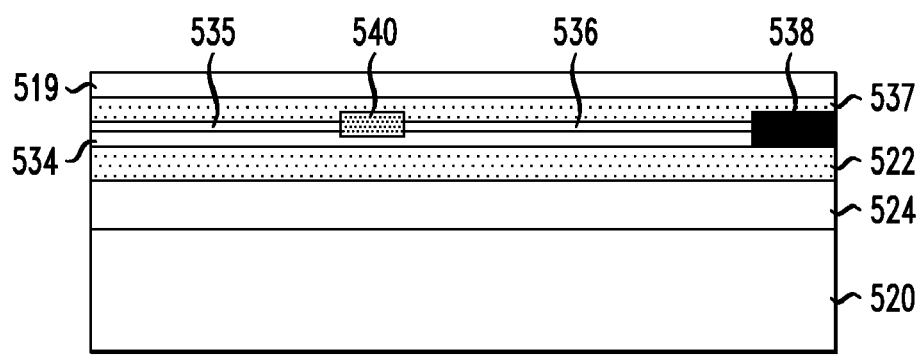

As shown in FIG. 5B, a top device layer is fabricated. Namely, the methodologies described in conjunction with the descriptions of FIG. 1 and FIGS. 2A-L, above, are used to fabricate analog CMOS/photonics circuitry layer 522 in a thick SOI layer (i.e., having BOX 524 with a thickness of greater than or equal to about one μm, i.e., greater than or equal to about two μm) over a, e.g., Si and/or a group III-V compound, such as GaAs, InP, InGaAs and/or InGaAsP, substrate 520. Analog CMOS/photonics circuitry layer 522 comprises analog CMOS and photonics components, such as analog modulators, analog drivers, analog TIAs, optical waveguides, optical detectors, switches and optical couplers.

As shown in FIG. 5B, semiconductor optical amplifier 540 is integrated in the top device layer. According to an exemplary embodiment, a preformed semiconductor optical amplifier unit is provided comprising semiconductor optical amplifier 540 over a (e.g., group III-V compound, such as InP) substrate. An oxide layer (not shown) is then deposited on semiconductor optical amplifier 540. Oxide layer 534 is deposited on analog CMOS/photonics circuitry layer 522. Semiconductor optical amplifier 540 is then bonded to analog CMOS/photonics circuitry layer 522 by way of an oxide-to-oxide bond, e.g., between the oxide layer on semiconductor optical amplifier 540 and oxide layer 534 on analog CMOS/photonics circuitry layer 522. Oxide-to-oxide bonding was described in detail above. By way of example only, the oxide layer can be deposited on a side of semiconductor optical amplifier 540 opposite the substrate, and the semiconductor optical amplifier unit flipped for bonding to analog CMOS/photonics circuitry layer 522. The semiconductor optical amplifier substrate can then be removed, e.g., using CMP. As shown in FIG. 5B, a fiber coupler, i.e., fiber coupler 538, is also formed in the top device layer.

Metal pads 535 and 536 are then formed over oxide layer 534. Metal pads 535 and 536 are connected to one or more of the analog CMOS/photonics components by way of intra-layer conductive vias (not shown). Metal pads 535 and 536 serve as connection points between the two device layers, i.e., when coupled with an inter-layer conductive via(s) (see below).

Oxide layer 537 is deposited over metal pads 535 and 536/semiconductor optical amplifier 540/fiber coupler 538. Bonding oxide layer 519 is then deposited over oxide layer 537. Bonding oxide layer 519 will, as described above, be used in forming an oxide-to-oxide bond with a corresponding bonding oxide layer on the bottom device layer.

Figure 5C:
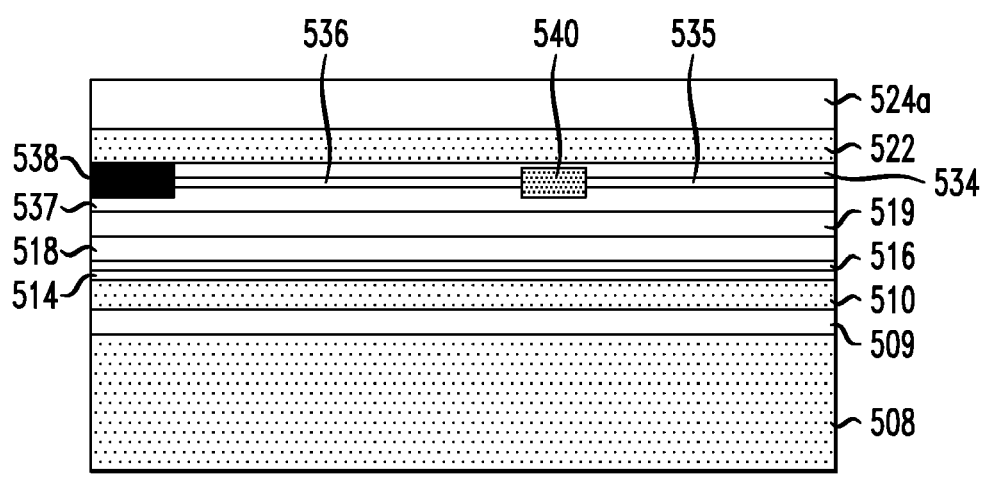

As shown in FIG. 5C, the top device layer is flipped and an oxide-to-oxide bond is formed between the top device layer and the bottom device layer (i.e., between bonding oxide layers 518 and 519, respectively). Face-to-face oxide bonding was described in detail above.

Substrate 520 (see FIG. 5B, described above) is then removed, e.g., using grinding, CMP and/or deep RIE. During the substrate removal, as described above, BOX 524 may thinned from its original thickness of, i.e., greater than or equal to about one μm, e.g., greater than or equal to about two μm, to greater than or equal to about 0.5 μm, e.g., greater than or equal to about one μm, respectively, resulting in BOX 524a.

Figure 5D:
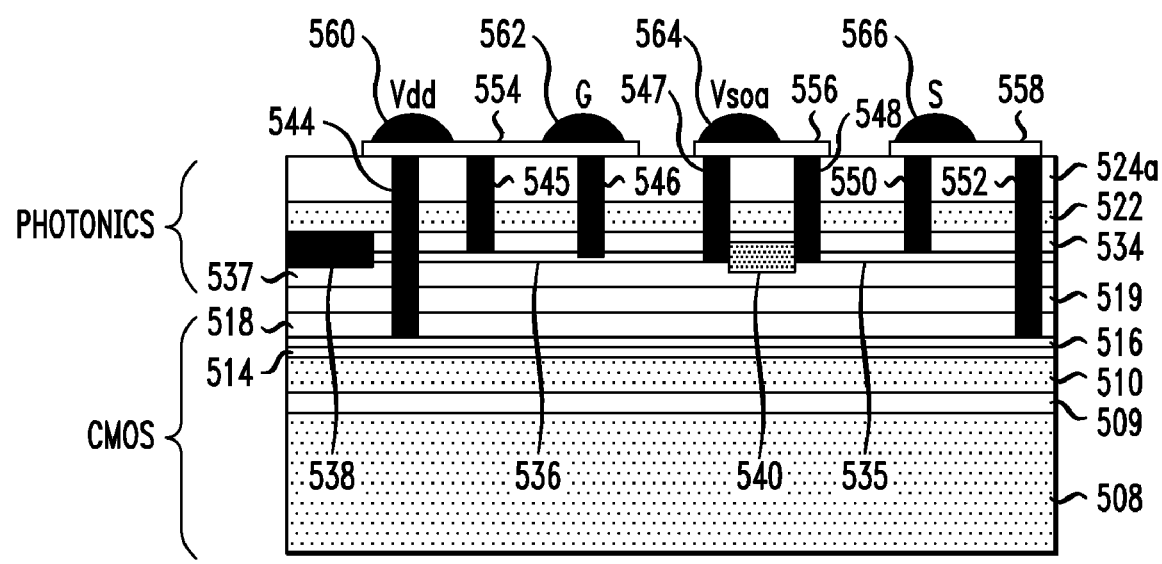

As shown in FIG. 5D, conductive vias 544, 545, 546, 547, 548, 550 and 552 are formed. The formation of conductive vias was described in detail above. Conductive vias 544, 545, 546, 547, 548, 550 and 552 are inter-layer conductive vias, connecting the top and bottom device layers. Metal pads 554, 556 and 558 are formed on BOX 524a. The formation of metal pads was described in detail above. As shown in FIG. 5D, one or more of the metal pads are in contact with one or more of the conductive vias.

For illustrative purposes, the bottom device layer and the top device layer are shown labeled in FIG. 5D, i.e., the bottom device layer labeled "CMOS" (to indicate that the bottom device layer comprises digital CMOS circuitry, as described above) and the top device layer labeled "Photonics" (to indicate that the top device layer comprises analog CMOS/photonics circuitry, as described above). Contacts, i.e., solder bumps, 560 and 562/564/566 are formed over metal pads 554/556/558, respectively. As shown in FIG. 5D, contact 560 acts a power contact to the analog CMOS/photonics components and/or digital CMOS components (labeled "Vdd"), contact 562 acts as a ground contact (labeled "G"), contact 564 acts as a power contact to the semiconductor optical amplifier (labeled "Vsoa") and contact 566 acts a source contact (labeled "S").

Figure 6A:
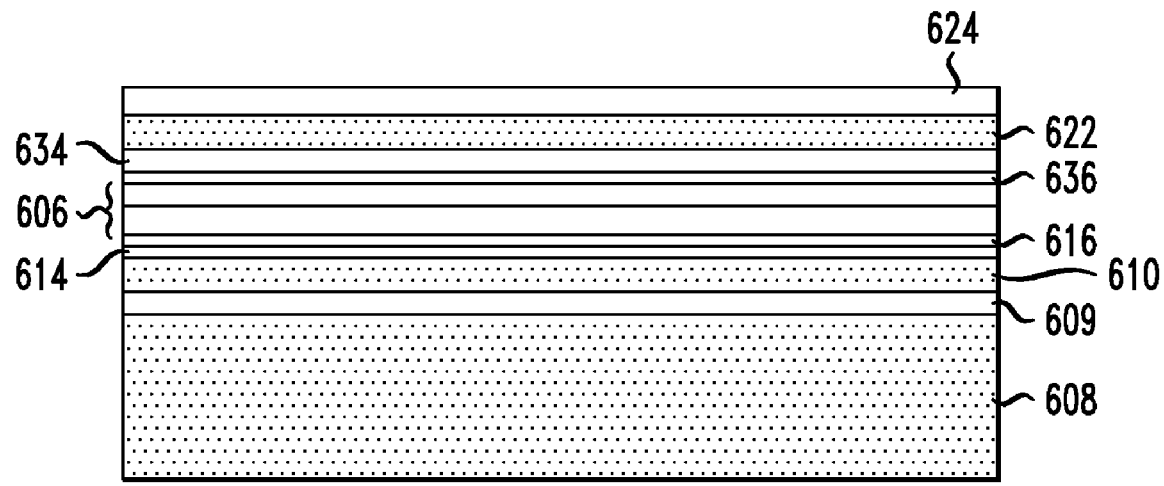
FIGS. 6A-C are cross-sectional diagrams illustrating a further exemplary methodology for fabricating a three-dimensional integrated circuit according to an embodiment of the present invention.
Figure 6B:
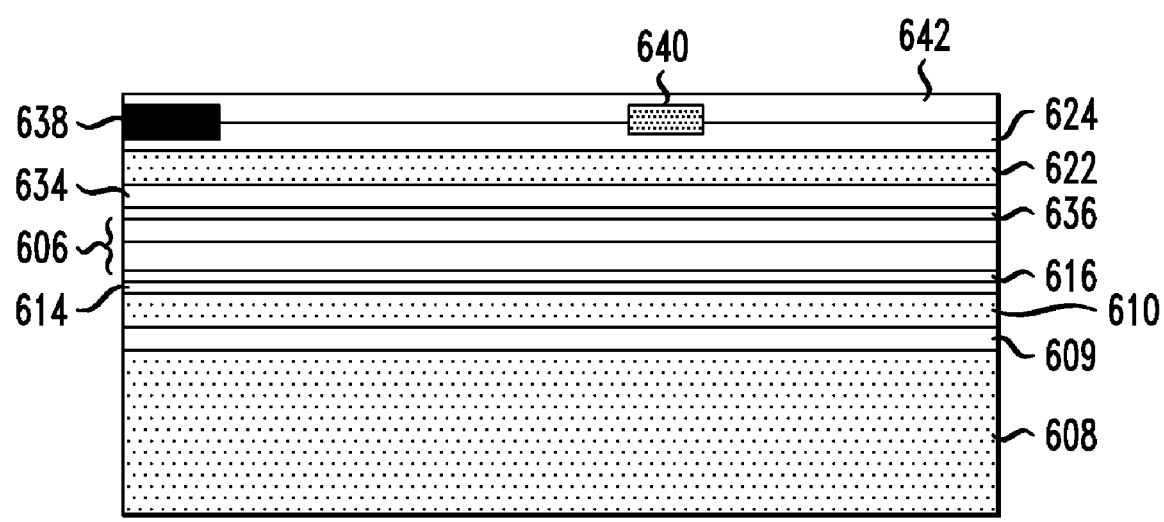
Figure 6C:
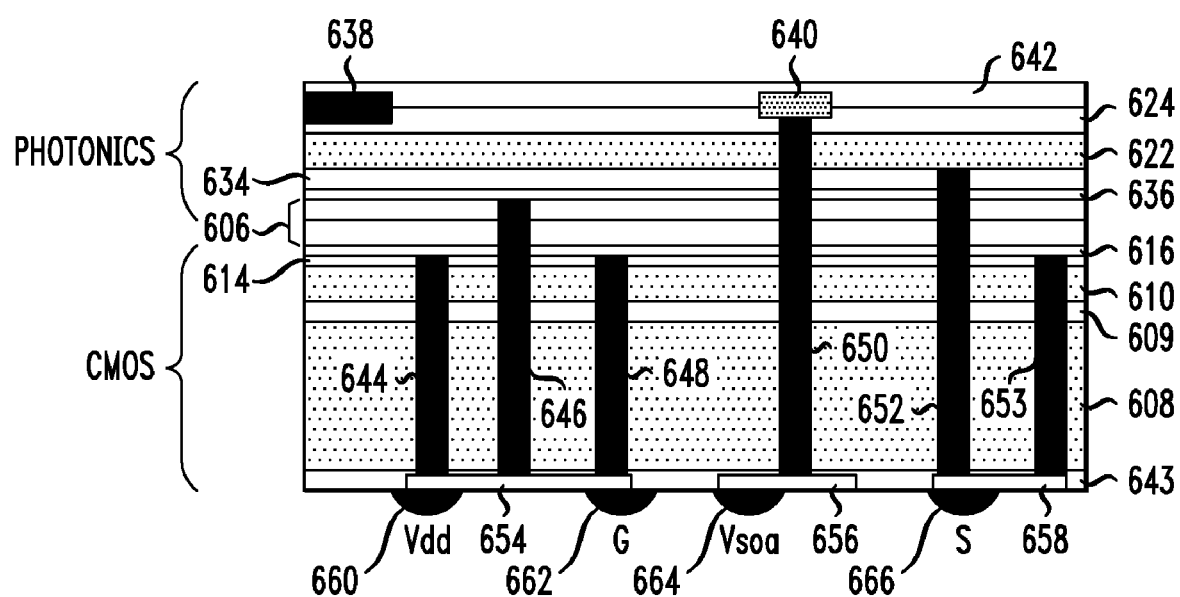

FIGS. 6A-C are cross-sectional diagrams illustrating a further exemplary methodology for fabricating a three-dimensional integrated circuit. FIG. 6A illustrates an integrated circuit fabricated using the methodologies described in conjunction with the descriptions of FIG. 1 and FIGS. 2A-L, above. As such, the integrated circuit comprises a, e.g., Si, GaAs, SiGe and/or glass, substrate 608, a SOI layer adjacent to substrate 608 having BOX 609, digital CMOS circuitry layer 610 formed in the SOI layer, analog CMOS/photonics circuitry layer 622, formed in a thick SOI layer having BOX 624 and bonded oxide layer 606 between digital CMOS circuitry layer 610 and analog CMOS/photonics circuitry layer 622.

Digital CMOS circuitry layer 610 comprises digital CMOS components, e.g., digital logic CMOS components. Digital CMOS circuitry layer 610 has a metal layer, i.e., metal layer 616, associated therewith. While metal layer 616, for ease of depiction, is shown as a single, solid layer, metal layer 616 may in fact comprise a number of individual metal pads, such as metal pads 314, 316 and 318, e.g., in FIG. 3. Metal layer 616 is separated from digital CMOS circuitry layer 610 by insulating layer 614 (e.g., an oxide layer). Any suitable deposition techniques can be employed to form insulating layer 614 prior to metal layer 616, i.e., during the formation of the bottom device layer. Metal layer 616 is connected to one or more of the digital CMOS components by way of intra-layer conductive vias (not shown). Metal layer 616 serves as a connection point between the two device layers, i.e., when coupled with an inter-layer conductive via(s) (see below).

Bonded oxide layer 606 is formed from the union of corresponding oxide layers of the bottom and top device layers, as was described above. This oxide-to-oxide bond is formed in a face-to-face bonding orientation. It is important to keep in mind when viewing FIG. 6A that the top device layer is flipped during fabrication so as to permit face-to-face bonding with the bottom device layer (see description above).

Analog CMOS/photonics circuitry layer 622 comprises analog CMOS and photonics components, such as analog modulators, analog drivers, analog TIAs, optical waveguides, optical detectors, switches and optical couplers. Analog CMOS/photonics circuitry layer 622 has a metal layer, i.e., metal layer 636, associated therewith. While metal layer 636, for ease of depiction, is shown as a single, solid layer, metal layer 636 may in fact comprise a number of individual metal pads, such as metal pads 336 and 338, e.g., in FIG. 3. Metal layer 636 is separated from analog CMOS/photonics circuitry layer 622 by insulating layer 634 (e.g., an oxide layer). Any suitable deposition techniques can be employed to form insulating layer 634 prior to metal layer 636, i.e., during the formation of the top device layer. Metal layer 636 is connected to one or more of the analog CMOS/photonics components by way of intra-layer conductive vias (not shown). Metal layer 636 serves as a connection point between the two device layers, i.e., when coupled with an inter-layer conductive via(s) (see below).

During the substrate removal from the top device layer, as described above, BOX 624 may be thinned from its original thickness of, i.e., greater than or equal to about one µm, e.g., greater than or equal to about two µm, to greater than or equal to about 0.5 µm, e.g., greater than or equal to about one µm, respectively. BOX 624 will serve as a platform for integrating a semiconductor optical amplifier in the integrated circuit (see FIG. 6B, described below).

As shown in FIG. 6B, semiconductor optical amplifier 640 is integrated in the circuit. According to an exemplary embodiment, a preformed semiconductor optical amplifier unit is provided comprising semiconductor optical amplifier 640 over a (e.g., group III-V compound, such as InP) substrate. An oxide layer (not shown) is then deposited on semiconductor optical amplifier 640. An oxide layer (not shown) may also be deposited on BOX 624. Semiconductor optical amplifier 640 is then bonded to BOX 624 by way of an oxide-to-oxide bond, e.g., between the oxide layer on semiconductor optical amplifier 640 and the oxide layer on BOX 624 (or directly to BOX 624). Oxide-to-oxide bonding was described in detail above. By way of example only, the oxide layer can be deposited on a side of semiconductor optical amplifier 640 opposite the substrate, and the semiconductor optical amplifier unit flipped for bonding to BOX 624. The semiconductor optical amplifier substrate can then be removed, e.g., using CMP. As shown in FIG. 6B, a fiber coupler, i.e., fiber coupler 638, is also formed in the top device layer. Oxide layer 642 is then deposited over BOX 624/semiconductor optical amplifier 640/fiber coupler 638.

As shown in FIG. 6C, oxide layer 643 is formed adjacent to the bottom device layer substrate (i.e., substrate 608). Conductive vias 644, 646, 648, 650, 652 and 653 are then formed. The formation of conductive vias was described in detail above. It is notable that each of conductive vias 644, 646, 648, 650, 652 and 653 extend through substrate 608. As described above, substrate 608 can comprise Si. In that instance, conductive vias 644, 646, 648, 650, 652 and 653 are also referred to herein as TSVs. Conductive vias 644, 646, 648, 652 and 653 are inter-layer conductive vias, connecting the top and bottom device layers. As will be described in detail below, conductive via 650 acts as a power connection to semiconductor optical amplifier 640. Metal pads 654, 656 and 658 are formed in oxide layer 643. The formation of metal pads was described in detail above. As shown in FIG. 6C, one or more of the metal pads are in contact with one or more of the conductive vias.

It is to be understood that the integrated circuit shown illustrated in FIG. 6C represents the union, e.g., by way of face-to-face oxide-to-oxide bonding, of the two device layers, i.e., the bottom device layer and the top device layer. For illustrative purposes, the bottom device layer and the top device layer are shown labeled in FIG. 6C, i.e., the bottom device layer labeled "CMOS" (to indicate that the bottom device layer comprises digital CMOS circuitry, as described above) and the top device layer labeled "Photonics" (to indicate that the top device layer comprises analog CMOS/photonics circuitry, as described above). However, the following description is directed to these device layers as having been integrated together to form a common three-dimensional integrated circuit.

Contacts, i.e., solder bumps, 660 and 662/664/666 are formed over metal pads 654/656/658, respectively. As shown in FIG. 6C, contact 660 acts a power contact to the analog CMOS/photonics components and/or digital CMOS components (labeled "Vdd"), contact 662 acts as a ground contact (labeled "G"), contact 664 acts as a power contact to the semiconductor optical amplifier (labeled "Vsoa") and contact 666 acts a source contact (labeled "S").

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a three-dimensional integrated circuit, comprising the steps of:
    forming a bottom device layer by forming a digital CMOS circuitry layer adjacent to a first substrate and depositing a first bonding oxide layer over a side of the digital CMOS circuitry layer opposite the first substrate;
    forming a top device layer by forming an analog CMOS and photonics circuitry layer in a SOI layer adjacent to a second substrate, the SOI layer having a BOX with a thickness of greater than or equal to about one micrometer and depositing a second bonding oxide layer over a side of the analog CMOS and photonics circuitry layer opposite the second substrate;
    forming an oxide-to-oxide bond between the first bonding oxide layer and the second bonding oxide layer; and
    removing the second substrate from the top device layer so as to expose the BOX.

2. The method of claim 1, wherein the digital CMOS circuitry layer comprises a plurality of digital complementary metal-oxide semiconductor logic components.

3. The method of claim 1, wherein the analog CMOS and photonics circuitry layer comprises one or more of analog modulators, analog drivers, analog transimpedance amplifiers, optical waveguides, optical detectors, switches and optical couplers.

4. The method of claim 1, wherein the BOX has a thickness of greater than or equal to about two micrometers.

5. The method of claim 1, further comprising the steps of:
forming one or more metal pads on the digital CMOS circuitry layer; and
connecting the metal pads to one or more of the digital CMOS logic components with intra-layer conductive vias.

6. The method of claim 1, further comprising the steps of:
forming one or more metal pads in the analog CMOS and photonics circuitry layer; and
connecting the metal pads to one or more of the analog modulators, the analog drivers, the analog transimpedance amplifiers, the optical waveguides, the optical detectors, the switches and the optical couplers with intra-layer conductive vias.

7. The method of claim 1, further comprising the step of:
forming one or more inter-layer conductive vias interconnecting the top device layer and the bottom device layer.

8. The method of claim 1, further comprising the step of:
flipping the top device layer so as to permit face-to-face bonding between the bonding oxide layer of the top device layer and the bonding oxide layer of the bottom device layer.

9. The method of claim 1, wherein the second substrate is removed from the top device layer using one or more of grinding, chemical-mechanical polishing and deep reactive ion etching.

10. The method of claim 1, wherein the step of removing the second substrate from the top device layer reduces the thickness of the BOX by up to about 50 percent.

11. The method of claim 1, further comprising the steps of:
providing a semiconductor optical amplifier; and
bonding the semiconductor optical amplifier to the analog CMOS and photonics circuitry layer.

12. The method of claim 11, wherein the bonding step further comprises the step of:
forming an oxide-to-oxide bond between an oxide layer deposited over the semiconductor optical amplifier and an oxide layer deposited over the analog CMOS and photonics circuitry layer.

\* \* \* \* \*